(12) United States Patent
Otremba

(10) Patent No.: US 12,347,754 B2
(45) Date of Patent: Jul. 1, 2025

(54) PACKAGE WITH LOAD TERMINALS ON WHICH COUPLED POWER COMPONENT AND LOGIC COMPONENT ARE MOUNTED

(71) Applicant: Infineon Technologies AG, Neubiberg (DE)

(72) Inventor: Ralf Otremba, Kaufbeuren (DE)

(73) Assignee: Infineon Technologies AG, Neubiberg (DE)

( * ) Notice: Subject to any disclaimer, the term of this patent is extended or adjusted under 35 U.S.C. 154(b) by 507 days.

(21) Appl. No.: 17/502,156

(22) Filed: Oct. 15, 2021

(65) Prior Publication Data

US 2022/0173023 A1 Jun. 2, 2022

(30) Foreign Application Priority Data

Nov. 27, 2020 (DE) ...................... 10 2020 131 470.1

(51) Int. Cl.
*H01L 23/495* (2006.01)
*H01L 23/00* (2006.01)

(52) U.S. Cl.
CPC .. *H01L 23/49575* (2013.01); *H01L 23/49562* (2013.01); *H01L 24/32* (2013.01); *H01L 24/48* (2013.01); *H01L 24/73* (2013.01); *H01L 2224/32245* (2013.01); *H01L 2224/48137* (2013.01); *H01L 2224/48177* (2013.01); *H01L 2224/73265* (2013.01)

(58) Field of Classification Search
CPC ......... H01L 23/49575; H01L 23/49562; H01L 24/32; H01L 24/48; H01L 24/73; H01L 2224/32245; H01L 2224/48137; H01L 2224/48177; H01L 2224/73265; H01L 25/16; H01L 24/29; H01L 24/49; H01L 2224/0603; H01L 2224/48091; H01L 2224/48247; H01L 2224/49171; H01L 2924/00014; H01L 23/4952; H01L 23/49551; H01L 2224/4903; H01L 2224/49175; H01L 2924/181
See application file for complete search history.

(56) References Cited

U.S. PATENT DOCUMENTS

| | | | |
|---|---|---|---|
| 5,057,906 | A | 10/1991 | Ishigami |
| 7,449,778 | B2 | 11/2008 | Sander |
| 8,552,541 | B2 | 10/2013 | Lim et al. |
| 9,153,564 | B2 | 10/2015 | Kim et al. |
| 9,257,376 | B2 | 2/2016 | Song |
| 9,754,864 | B1 | 9/2017 | Xue et al. |

(Continued)

FOREIGN PATENT DOCUMENTS

| | | |
|---|---|---|
| DE | 10 2004 021 054 | 11/2005 |
| DE | 10 2006 020 243 | 1/2008 |

(Continued)

*Primary Examiner* — Robert G Bachner
(74) *Attorney, Agent, or Firm* — Dicke, Billig & Czaja, PLLC

(57) ABSTRACT

A package is disclosed. In one example, the package comprises a first load terminal, a second load terminal, a power component mounted on the first load terminal, and a logic component electrically conductively mounted on one of the first load terminal. The logic component is the second load terminal and electrically connected with the power component for controlling the power component.

1 Claim, 2 Drawing Sheets

(56) References Cited

U.S. PATENT DOCUMENTS

| | | | |
|---|---|---|---|
| 2008/0001279 A1* | 1/2008 | Elbanhawy | H01L 25/16 257/691 |
| 2011/0233759 A1 | 9/2011 | Shiga | |
| 2014/0118056 A1 | 5/2014 | Amada | |
| 2016/0172280 A1 | 6/2016 | Ranmuthu | |
| 2016/0293543 A1* | 10/2016 | Otremba | H01L 23/49575 |
| 2018/0166366 A1* | 6/2018 | Fuergut | H01L 23/3114 |
| 2018/0175846 A1* | 6/2018 | Meiser | H01L 29/7802 |

FOREIGN PATENT DOCUMENTS

| | | |
|---|---|---|
| DE | 10 2016 111 573 | 12/2016 |
| JP | 2012-104633 | 5/2012 |

\* cited by examiner

PACKAGE WITH LOAD TERMINALS ON WHICH COUPLED POWER COMPONENT AND LOGIC COMPONENT ARE MOUNTED

CROSS-REFERENCE TO RELATED APPLICATION

This Utility Patent Application claims priority to German Patent Application No. 10 2020 131 470.1, filed Nov. 27, 2020, which is incorporated herein by reference.

BACKGROUND

Technical Field

Various embodiments relate generally to a package and an electronic device.

Description of the related art

Packages may be denoted as usually encapsulated electronic components with electrical connects extending out of the encapsulant. For example, packages may be connected to an electronic periphery, for instance mounted on a printed circuit board and/or connected with a heat sink, and may be connected via connectors to a larger system.

Packaging cost is an important driver for the industry. Related with this are performance, dimensions and reliability. The different packaging solutions are manifold and have to address the needs of a specific application.

BRIEF DESCRIPTION OF THE DRAWINGS

The accompanying drawings, which are included to provide a further understanding of exemplary embodiments and constitute a part of the specification, illustrate exemplary embodiments.

In the drawings.

DETAILED DESCRIPTION

Figure 1:
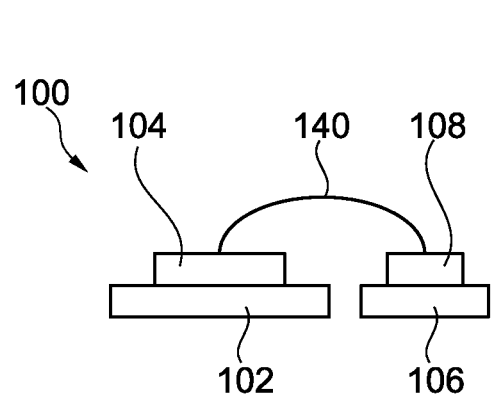
FIG. 1 illustrates a schematic cross-sectional view of a package according to an exemplary embodiment.

There is a need for a package with high performance and compact design.

According to an exemplary embodiment, a package is provided which comprises a first load terminal, a second load terminal, a power component mounted on the first load terminal, and a logic component electrically conductively mounted on one of the first load terminal and the second load terminal and electrically connected with the power component for controlling the power component.

According to another exemplary embodiment, an electronic device is provided, wherein the electronic device comprises a package having the above mentioned features, and a further electronic component (in particular a pulse width modulator or a micro-controller) electrically coupled with the package.

According to an exemplary embodiment, a package is provided which comprises a power component which may be controlled by a logic component, wherein each of the power component and the logic component is mounted on a respective one of two load terminals of a multi-body carrier. Advantageously, the logic component may be directly mounted on one of the load terminals and may thereby be directly electrically connected with said load terminal so that the bottom side of the logic component may be at a defined electric potential and may thereby be reliably prevented from floating. Hence, the direct electric assembly of the logic component on one of the load terminals may allow the logic component to be directly coupled with an electric potential (for example a reference potential such as ground) of this load terminal. According to an exemplary embodiment, a highly efficient and highly compact power package may be provided in which any free surface area of the load terminals may be freely used for mounting the mentioned electronic components. In particular, such a package may be highly compact in vertical direction, since a stacking of multiple chips on top of each other may be avoided. Hence, a package with an area optimized layout may be provided. Moreover, the side-by-side arrangement of the power component and the logic component may prevent hot spots, since the components being heat sources during operation of the package may be spatially separated.

Advantageously, a further electronic component such as a pulse width modulator may be externally connected with said package, in particular for providing the logic chip with signals. It is for instance possible that the pulse width modulator is coupled with a lead of the package, wherein said lead may be electrically connected, in turn, with the logic chip. However, another kind of further electronic component (for instance a micro-controller) may also provide an electric functionality from an external position of the package but being coupled with the package.

In the following, further exemplary embodiments of the package and the electronic device will be explained.

In the context of the present application, the term "package" may particularly denote an electronic member which may comprise electronic components which may be mounted on carrier bodies which are also denoted as terminals. Said constituents of the package may be optionally encapsulated at least partially by an encapsulant.

In the context of the present application, the term "component" may in particular encompass a semiconductor chip (in particular a power semiconductor chip), an active electronic device (such as a transistor), a passive electronic device (such as a capacitance or an inductance or an ohmic resistance), a sensor (such as a microphone, a light sensor or a gas sensor), an actuator (for instance a loudspeaker), and a microelectromechanical system (MEMS). In particular, an electronic component may be a semiconductor chip having at least one integrated circuit element (such as a diode or a transistor) in a surface portion thereof. The component may be a naked die or may be already packaged or encapsulated. Semiconductor chips implemented according to exemplary embodiments may be formed for example in silicon technology, gallium nitride technology, silicon carbide technology, etc.

In the context of the present application, the term "power component" may in particular denote a component configured for a power application, in particular a power semiconductor application. Such a power component may for instance be a transistor chip or a diode chip. When embodied as a transistor chip, the power component can be a field effect transistor chip (in particular a metal oxide semiconductor field effect transistor (MOSFET) chip) or a bipolar transistor chip (in particular an insulated gate bipolar transistor (IGBT) chip). For example, a power component may be a semiconductor device used as switch or rectifier in power electronics.

In the context of the present application, the term "logic component" may in particular denote a component configured for a control or regulating function. Hence, a logic chip may be in particular a processor or controller chip. A logic task may involve a processing capability in which for example a fixed operation is performed, or a set of instructions is executed that may vary.

In the context of the present application, the term "terminal" may in particular denote an electrically conductive (for instance plate-shaped or strip-shaped) element (which may be planar or bent) which may serve for carrying and/or electrically connecting an electronic component. For instance, a die pad or a lead, or any other carrier or leadframe structure may be terminals. More specifically, terminals may be carrier bodies of a multi-body carrier. A terminal may be partially encapsulated and partially exposed with respect to an encapsulant so that a terminal may be accessible from an exterior of a package. A terminal may be at a fixed or at a varying electric potential during operation of the package.

In the context of the present application, the term "load terminal" may in particular denote a terminal which is connected within a power path or current path of the power component, i.e. an electric path along which a power signal or load signal is transported. In contrast to this, a control terminal to which a control signal is applied is a terminal which is not a load terminal. As an example, when the power component is embodied as field effect transistor chip, a source terminal of a carrier electrically connected with a source pad of the power component and a drain terminal of the carrier electrically connected with a drain pad of the power component may be the two only load terminals of the carrier.

In the context of the present application, the term "component electrically conductively mounted on a load terminal" may in particular denote that a main face of the component is attached to said load terminal to establish a direct electric connection in between and therefore in such a way that the electric potential at said main face of the component and at said load terminal may be identical. In particular, the component may be mounted by an electrically conductive connection medium (such as solder, sinter or electrically conductive adhesive) directly on said load terminal. For example, a bottom sided surface of the logic component may be directly soldered or glued (with electrically conductive glue) onto the metallic surface of the respective load terminal without an electric isolation in between. Thus, the bottom side of the logic component may be substantially at the same electric potential as the top side of the respective load terminal on which it is mounted.

In the context of the present application, the term "further electronic component" may in particular denote a semiconductor chip (in particular a power semiconductor chip), an active electronic device (such as a transistor), a passive electronic device (such as a capacitance or an inductance or an ohmic resistance), a sensor (such as a microphone, a light sensor or a gas sensor), an actuator (for instance a loudspeaker), and a microelectromechanical system (MEMS). In particular, the electronic component may be a semiconductor chip having at least one integrated circuit element (such as a diode or a transistor) in a surface portion thereof The electronic component may be a naked die or may be already packaged or encapsulated. Semiconductor chips implemented according to exemplary embodiments may be formed for example in silicon technology, gallium nitride technology, silicon carbide technology, etc.

In the context of the present application, the term "pulse width modulator" may in particular denote an electronic member which is configured for carrying out pulse-width modulation (PWM) for modulating (in particular reducing) an average power delivered by an electrical signal, by effectively chopping it up into discrete parts. The average value of voltage and current fed to the destination may be controlled by turning the switch between supply and load "on" and "off" at a fast rate. The longer the switch is "on" compared to the "off" periods, the higher the total power supplied to the load.

In an embodiment, the logic component is mounted on the second load terminal. Hence, logic component and power component may be mounted on different load terminals, one on each. By taking this measure, free mounting areas on both load terminals may be used for component assembly when creating the package. Even more importantly, when the logic component and the power component are mounted on separate load terminals, a better thermal separation between the electronic components and thus a better package performance may be obtained. Hot spots may be avoided in this way. The thermal reliability of the package may be improved in particular in comparison with stacked-chips packages.

In an embodiment, the first load terminal is a die pad. A die pad may denote a plate-shaped and preferably planar carrier structure intended for mounting an electronic chip thereon, in the present case the power component. For instance, a die pad may be a rectangular flat metal sheet.

In an embodiment, the second load terminal is a lead or lead structure. In the case of a leadframe-type carrier for carrying electronic components, i.e. power component and logic component, the above-mentioned die pad may be accompanied by one or more leads. Such leads may be rectangular or strip-shaped metallic sheet bodies (or may have a more complex shape) which may be exposed in a readily manufactured package so that it can be electrically coupled with an electronic periphery of the package. For instance, a lead may be partially encapsulated and partially exposed with respect to an encapsulant. Advantageously, such a lead may function as a mounting base for mounting an electronic component, in particular the logic component.

In an embodiment, the first load terminal and the second load terminal form part of a common patterned metal plate, in particular form part of a leadframe. Such a leadframe may be a patterned metal plate, for instance made of copper and/or aluminum. Such a leadframe may serve as a mounting base or carrier for electronic components, in particular power component and logic component, and may also contribute to an electric coupling and decoupling, respectively, of such electronic components.

In an embodiment, a carrier comprising the load terminals may alternatively comprise a stack composed of a central electrically insulating and thermally conductive layer (such as a ceramic layer) covered on both opposing main surfaces by a respective electrically conductive layer (such as a copper layer or an aluminium layer, wherein the respective electrically conductive layer may be a continuous or a patterned layer). In particular, the carrier comprising the loads terminals may be a Direct Copper Bonding (DCB) substrate or a Direct Aluminium Bonding (DAB) substrate. However, the carrier may also be configured as Active Metal Brazing (AMB) substrate.

In an embodiment, the one of the first load terminal and the second load terminal on which the logic component is mounted is configured to be at a fixed predefined electric potential during operation of the package. Mounting the logic component with direct electric connection on such a load terminal may prevent the logic component from floating and ensures well-defined operation conditions.

In an embodiment, the one of the first load terminal and the second load terminal on which the logic component is mounted is an electric ground potential terminal, i.e. is at electric ground potential during operation of the package. Advantageously, the load terminal on which the logic component is assembled may thus be at a predefined electric potential. This may prevent the logic component from floating, i.e. from being at an undefined electric potential level during operation of the package. Preferably, the load terminal carrying the logic component and being directly electrically connected with the latter may be at electric ground potential during operation of the package. Thus, the logic component may be operated at predefined electric conditions and may use the underlying load terminal not only as a mounting base, but also for providing a defined electric voltage level.

Preferably, a chip back side of the logic component may be directly electrically conductively mounted on said load terminal. Said chip back side may then be brought to a well-defined electric potential which allows operation of the logic component under defined electric conditions. The chip front side may then be oriented upwardly and may be electrically coupled with the power component, a respective load terminal, and/or a separate lead by one or more electrically conductive connection elements (such as bond wires, bond ribbons or clips).

In an embodiment, the logic component provides at least one of a drive function for driving the power component, and a sense function for sensing a signal (for example from the power component, or from an exterior side of the package) to be used as a basis for controlling or regulating the power component. In other words, the power component may be operated under control of the logic component, which may apply one or more electrical control signals via an electrically conductive connection element electrically coupling the logic component with the power component. Thus, the logic component may function as a driver of the power component. Additionally or alternatively, it is also possible that the logic component operates for signal sensing. For example, the logic component may monitor a voltage signal sensed at a certain pad (for instance at a source sense pad) of the power component. It is also possible that a signal sensed by the logic component is indicative of a temperature, so that a temperature-based control of the power component may be possible (for instance a control of the power component based on the temperature-dependent signal sensed by the logic component). Generally, a sensed signal may for example be a voltage signal, a current signal or a temperature signal.

In an embodiment, the power component is a transistor component comprising a first load pad, a second load pad, and a control pad. Hence, the power component may have a monolithically integrated transistor, which may in particular be a field effect transistor or a bipolar transistor. A transistor may have three connections or pads, namely two load pads and one control pad. While an electric load signal can be transported along a load path between the load pads, the transistor can be switched (for instance between a conductive state and a non-conductive state) by a control signal applied to the control pad.

More specifically, when the power component is a field effect transistor component (such as a MOSFET), the transistor chip comprises a source pad as first load pad, a drain pad as second load pad, and a gate pad as control pad. Each of the first and second load pads may be electrically connected with a respective load terminal of a carrier of the package. The gate pad may be electrically coupled with the logic component so that a control signal can be supplied from the logic component to the gate pad of the power component. The main current flow corresponding to a current path of the power component flows between source pad and drain pad, when the signal applied to the gate pad switches the field effect transistor into a conductive state.

In an embodiment, the drain pad covers one main surface of the power component (for instance a main surface on which the power component is mounted on the first load terminal). In contrast to this, source pad and gate pad may be arranged side-by-side on an opposing other main surface (in particular being oriented upwardly) of the power component (experiencing vertical current flow).

In another embodiment in which the power component is a bipolar transistor component (for instance an IGBT chip), the power component comprises a collector pad as first load pad, an emitter pad as second load pad, and a base pad as control pad. In this case, a control signal is to be applied to the base pad, whereas a power signal may be transported between emitter pad and collector pad.

Figure 5:
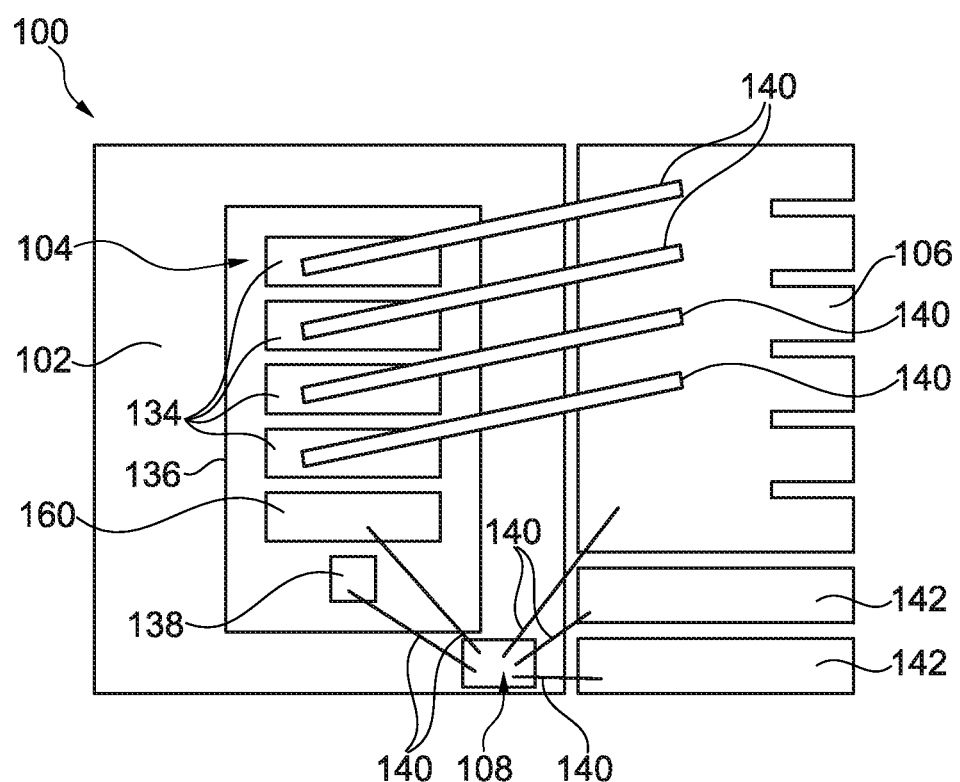
FIG. 5 illustrates a plan view of a package according to another exemplary embodiment.

In an embodiment, the one of the first load terminal and the second load terminal on which the logic component is mounted is a source terminal at the electric potential of a source pad of the power component (see for example FIG. 3) or a drain terminal at the electric potential of a drain pad of the power component (see for example FIG. 5). The source terminal may be an electric ground terminal.

In an embodiment, the power component has a larger surface area than the logic component. Correspondingly, the larger power component may be placed on the larger die pad of a leadframe, whereas the smaller logic component may find sufficient mounting space on a lead of the leadframe, or also on the die pad.

In an embodiment, a free surface, which is not covered by electrically conductive material, at a top side of the power component is smaller than a main surface of the logic component. In other words, a free surface (not covered by an electrically conductive connection element) at the top side of the power component may be smaller than a two-dimensional size of the logic component. In such a configuration, a chip-on-chip stacking of the components on top of each other is not appropriate, so that the side-by-side architecture according to an exemplary embodiment is particularly advantageous. This makes it also possible that the full main surface of the power component may be freely covered with electrically conductive material (of pads, electrically conductive connection elements, etc.) without any limitation.

In an embodiment, the power component is manufactured in one of the group consisting of silicon carbide (SiC) technology, and gallium nitride (GaN) technology. In particular silicon carbide or gallium nitride chips may be manufactured with very small dimensions. Although such very small power components are advantageous since they contribute to render the package more compact, their implementation may be incompatible with conventional package designs with a stacked configuration of a power component and a logic component. However, in particular the use of two different load terminals of a carrier for mounting power component and logic component side-by-side rather than vertically stacked renders the package architecture according to exemplary embodiments perfectly compatible with the implementation of very small power components manufactured according to silicon carbide technology or gallium nitride technology. A power component manufactured in particular in silicon carbide technology may be particularly appropriate for high switching frequencies above 100 kHz, in particular above 500 kHz, since such a switching operation can be carried out with low losses and high accuracy.

In an embodiment, the package comprises at least one electrically conductive connection element which electrically couples different constituents of the package. For instance, such an electrically conductive connection element may be a bond wire, a bond ribbon or a clip. While bond wires and bond ribbons may be tiny flexible electrically conductive elements having two terminals to be connected with a pad of one or both of the electronic components and/or with a terminal (for instance a lead or a die pad) of the carrier, a clip may be a three-dimensionally bent electrically conductive plate-shaped body to be attached on an upper main surface of a mounted electronic component and on an upper main surface of a carrier terminal.

In an embodiment, the package comprises at least one electrically conductive connection element (for instance of the above mentioned type) which electrically couples the logic component (in particular when being mounted in an electrically conductive way on the second load terminal) with the second load terminal. In such an embodiment, it is for instance possible that a top surface of the logic component is coupled by an electrically conductive connection element (such as a bond wire) with the source load terminal on which the bottom surface (in particular corresponding to the chip back side) of the logic component is mounted in an electrically conductive manner. Thus, an active front side of the logic component may be coupled with low effort (i.e. by a simple bond wire or the like) with the source terminal, and preferably with ground.

In an embodiment, the package comprises at least one electrically conductive connection element (for instance of the above mentioned type) which electrically couples the logic component with the power component. Thus, the chip-chip connection(s) may be established by one or more bond wires and hence with very low effort.

In an embodiment, the first load terminal and the second load terminal are connected within a current path of the package. The current path of the package may be the electric path along which the actual electric power signal propagates. For the example of a field effect transistor, the current path is the path between source pad and drain pad along which the power current flows.

In an embodiment, the power component is configured for a vertical current flow. In particular, electric current may flow between a drain pad on a lower main surface of the power component through semiconductor material of the power component to another pad at an upper main surface of the power component.

In an embodiment, the logic component is mounted on the one of the first load terminal and the second load terminal by an electrically conductive connection medium, in particular comprising at least one of the group consisting of silver glue, eutectic material, a soft solder, and a diffusion solder.

In an embodiment, the package comprises at least one third terminal. For instance, the third terminal may be a lead. When the first terminal is a die pad and the second terminal is another lead, the various leads may be located side-by-side. The second and the at least one third terminals may be electrically separate island-shaped plate structures which may be interconnected with low effort by an electrically conductive connection element such as a bond wire.

In an embodiment, the second load terminal and each of the at least one third terminal are arranged on the same side of the first load terminal. Arranging all leads on one and the same side of the first load terminal keeps the electric paths between the different terminals and between pads of the different electronic components short. This keeps electric and thermal losses small and results in a high-performance and a proper thermal reliability of the package. However, in alternative embodiments, leads may be arranged at two opposing sides of the die pad, or even at all four surrounding sides of the die pad.

In an embodiment, the package comprises at least one electrically conductive connection element (for instance of any of the above mentioned types) which electrically couples the logic component with the at least one third terminal. Hence, also the third terminal, which may for instance be connected with an exterior electronic member such as a pulse width modulator or a microprocessor, may be interconnected with the logic component with low effort and short electric path length.

In an embodiment, the package comprises an encapsulant at least partially encapsulating the first load terminal (which may be encapsulated only partially or entirely), the second load terminal (which may be encapsulated only partially), the power component (which may be encapsulated entirely), and the logic component (which may be encapsulated entirely). In the context of the present application, the term "encapsulant" may particularly denote a substantially electrically insulating and preferably thermally conductive material surrounding at least part of the electronic components to provide mechanical protection, electrical insulation, and optionally a contribution to heat removal during operation.

In an embodiment, the package comprises a plurality of electronic components mounted on the carrier or on different carriers. Thus, the package may comprise one or more additional electronic components (for instance at least one diode, a capacitor, and/or at least one additional active component, such as a semiconductor chip).

In an embodiment, the electronic device comprises a mounting base on which the package is mounted and being electrically coupled with the lead(s). Such a mounting base may be an electronic board serving as mechanical base for the package and being electrically couplable with the lead(s) of the package.

In an embodiment, any of electronic components of the package comprises at least one of the group consisting of a controller circuit, a driver circuit, and a power semiconductor circuit. All these circuits may be integrated into one semiconductor chip, or separately in different chips. For instance, a corresponding power semiconductor application may be realized by the chip(s), wherein integrated circuit elements of such a power semiconductor chip may comprise at least one transistor (in particular a MOSFET, metal oxide semiconductor field effect transistor), at least one diode, etc. In particular, circuits fulfilling a half-bridge function, a full-bridge function, etc., may be manufactured.

In an embodiment, the package is configured as power converter, in particular one of an AC/DC power converter and a DC/DC power converter. However, also other electronic applications, such as inverters, etc., may be possible.

As substrate or wafer for the semiconductor chips, a semiconductor substrate, i.e. a silicon substrate, may be used. Alternatively, a silicon oxide or another insulator substrate may be provided. It is also possible to implement a germanium substrate or a III-V-semiconductor material. Preferably, exemplary embodiments may be implemented in GaN or SiC technology.

Furthermore, exemplary embodiments may make use of standard semiconductor processing technologies such as appropriate etching technologies (including isotropic and anisotropic etching technologies, particularly plasma etching, dry etching, wet etching), patterning technologies (which may involve lithographic masks), deposition technologies (such as chemical vapor deposition (CVD), plasma enhanced chemical vapor deposition (PECVD), atomic layer deposition (ALD), sputtering, etc.).

The above and other objects, features and advantages will become apparent from the following description and the appended claims, taken in conjunction with the accompanying drawings, in which like parts or elements are denoted by like reference numbers.

The illustration in the drawing is schematically and not to scale.

Before exemplary embodiments will be described in more detail referring to the figures, some general considerations will be summarized based on which exemplary embodiments have been developed.

According to an exemplary embodiment, a package is provided which may be based on a leadframe-type multi-body carrier having a die pad and leads. Die pad and one of the leads may form two load terminals corresponding to two load pads (for instance a source pad and a drain pad) of a power component (for instance a field effect transistor chip) mounted on one of said load terminals. The power component mounted on one of said load terminals may be controlled by a logic component (such as a power chip controller) mounted on the same or another load terminal. Advantageously, a main surface (preferably a back side) of the logic component may be assembled in an electrically conductive way directly on the assigned load terminal. Further advantageously, the other side (preferably the front side) of the logic chip may be electrically connected with the power component, for instance by one or more bond wires. One or more further electric connections may be created starting from said front side as well. Such a package may be highly compact as a result of its advantageous layout design in which any free surface areas of the load terminals may be used for component assembly. At the same time, the package may have a high performance and proper thermal reliability thanks to the side-by-side arrangement of the components.

In particular, an exemplary embodiment provides a power package with a power chip mounted on a die pad (as one load terminal) and with a logic chip mounted on a lead (as other load terminal). Preferably, the power component is embodied as silicon carbide chip which can be manufactured with extremely small dimensions. Alternatively, it is also possible that the power component is manufactured as gallium nitride chip. Such an embodiment may provide a package having a high performance in particular for high voltage applications (for instance with operation voltages above 600V). The power component of the power package may be for example a MOSFET or an IGBT, whereas the logic component may be based on an integrated circuit chip which may be configured for driving and/or sensing. Such a package may be more compact in a vertical direction as compared with conventional chip-on-chip packages. With the package architecture according to an exemplary embodiment, which may be denoted as a chip-on-lead configuration, a remaining space on a lead area can be used for directly electrically conductively assembling the logic chip which may control the power chip without top/bottom-chip limitations. Preferably, the logic chip may be directly mounted on a source terminal (in particular a source lead) which may be at an electric reference potential such a ground potential. Thus, the logic chip may be prevented from floating, and preferably its back side may be brought to the reference potential. Preferably, said reference potential is the electric ground potential. Advantageously, this may allow to electrically ground the logic chip with low effort. Furthermore, this may allow to use the load terminal on which the logic chip is mounted as a ground terminal also for other constituents of the package circuitry, for example by bond wires which may be created with low effort.

Although the above description is based on the example of transistor chips (MOSFETs and IGBTs), other exemplary embodiments may also implement a chip providing a diode function, etc.

Preferably, the logic chip is mounted on its assigned load terminal (for instance a lead) by an electrically conductive die attach. Such a conductive die attach on lead may be accomplished for example by silver glue, eutectic material, soft or diffusion solder.

The described logic chip-on-lead package concept may be highly advantageously in particular for SiC or GaN chip technology due to the significantly reduced chip size compared to conventional power devices. Beneficially, such a package does not have top/bottom chip limitations. In particular, exemplary embodiments may be advantageously implemented as power packages with vertical power component.

FIG. 1 illustrates a cross-sectional view of a package 100 according to an exemplary embodiment.

The package 100 according to FIG. 1 comprises a first load terminal 102 and a second load terminal 106. A power component 104 is mounted on the first load terminal 102. Furthermore, a logic component 108 is provided which is electrically conductively mounted on the second load terminal 106. Beyond this, the logic component 108 is electrically connected with the power component 104 (for example by an electrically conductive connection element 140) for controlling the power component 104.

Figure 2:
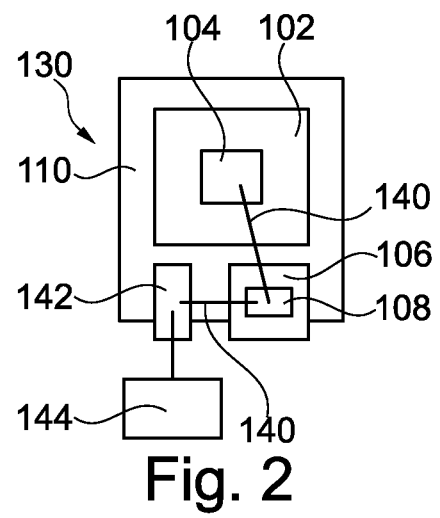
FIG. 2 illustrates an electronic device according to an exemplary embodiment.

FIG. 2 illustrates an electronic device 130 according to an exemplary embodiment.

The electronic device 130 according to FIG. 2 comprises a package 100 and a pulse width modulator 144 electrically coupled with the package 100.

What concerns the package 100, it comprises a die pad-type first load terminal 102, a lead-type second load terminal 106, and a lead-type third terminal 142. A power component 104 is mounted on the first load terminal 102. A logic component 108 is electrically conductively mounted on the second load terminal 106. The logic component 108 is electrically connected with the power component 104 by an electrically conductive connection element 140 and is configured for controlling the power component 104. A further electrically conductive connection element 140 is provided for electrically coupling the logic component 108 with the third terminal 142.

An encapsulant 110 encapsulates the power component 104, the logic component 108, the first load terminal 102, and only part of the second load terminal 106 as well as only part of the third terminal 142.

The pulse width modulator 144 is connected with the third terminal 142 for providing an electric signal. Said electric signal may be conducted from the third terminal 142 via the connected electrically conductive connection element 140 to the logic component 108. The logic component 108 may use this electric signal also as a basis for operating or controlling the power component 104 by another electric signal conducted that via a further electrically conductive connection element 140 to the power component 104.

Figure 3:
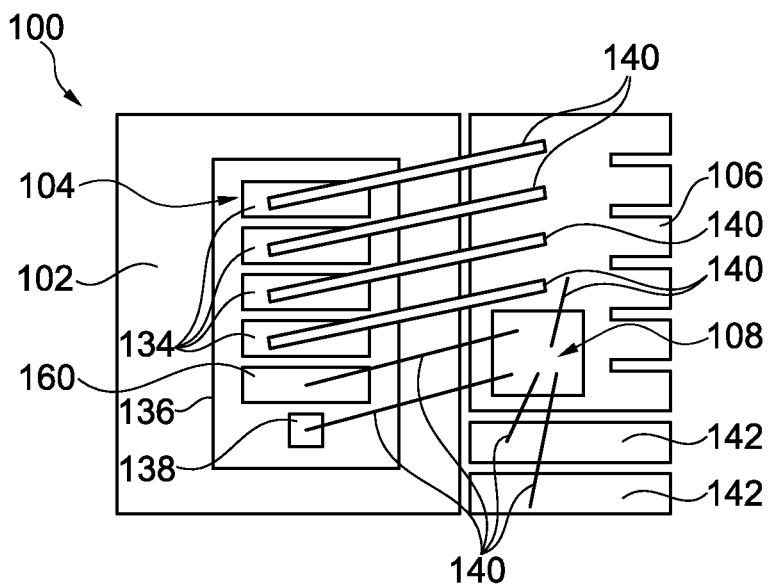
FIG. 3 illustrates a plan view of a package according to an exemplary embodiment.
Figure 4:
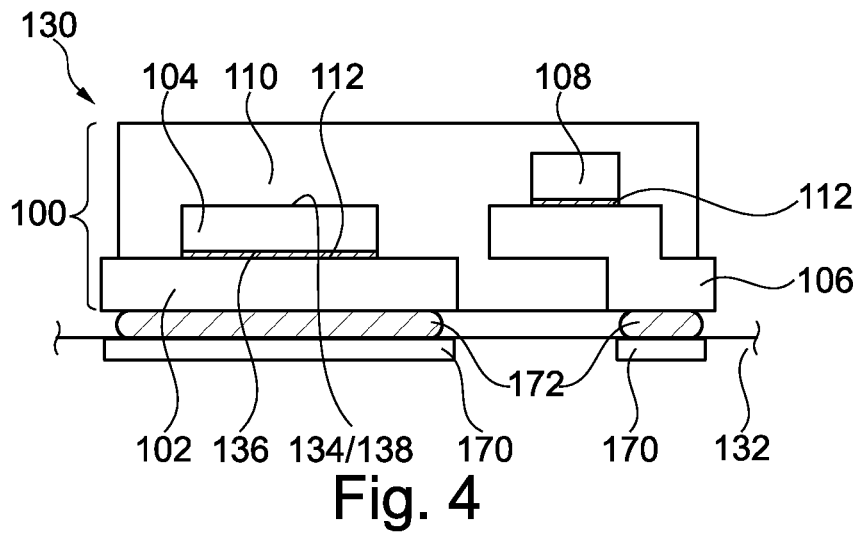
FIG. 4 illustrates a cross-sectional view of the package according to FIG. 3 after encapsulation by an encapsulant and after mounting of the package on a mounting base.

FIG. 3 illustrates a plan view of a package 100 according to an exemplary embodiment which is configured as a power semiconductor package. FIG. 4 illustrates a cross-sectional view of the package 100 according to FIG. 3 after encapsulation by an encapsulant 110 and after mounting the package 100 on a mounting base 132.

The package 100 comprises a multi-body carrier comprising a first load terminal 102, a second load terminal 106, and (in this embodiment two) third terminals 142. Constituents 102, 106, 142 being separate bodies of the carrier may form part of a common patterned metal plate (for instance made of copper and/or aluminum) and may be embodied as a leadframe-type carrier.

As shown, the first load terminal 102 is the largest body of the multi-body carrier. First load terminal 102 is here embodied as a rectangular flat metal sheet and is configured as die pad.

Second load terminal 106 is embodied as smaller rectangular metal sheet having multiple recesses on one side to thereby define multiple different lead tongues which are however at the same electric potential. As shown in FIG. 4, the metal sheet forming second load terminal 106 may be bent or curved.

The third terminals 142 are metal strips and form separate additional leads which may be bent or curved as well.

The second load terminal 106 and the third terminals 142 are arranged side by side and are all arranged on the same side of the first load terminal 102. The lead-type terminals 106, 142 may be bent (for instance with gull-wing shape, compare FIG. 4) or may be planar.

A power component 104 is mounted on the first load terminal 102 by an electrically conductive connection medium 112 to thereby create a direct electric connection between the bottom of the power component 104 and the top side of the metallic first load terminal 102. Power component 104 is here embodied as a power semiconductor chip, and more specifically as metal oxide semiconductor field effect transistor (MOSFET) chip. Since the power component 104 is a transistor component of the field effect transistor type, it comprises on its top side (which faces away from the leadframe) a first load pad 134 embodied as source pad, and a control pad 138 embodied as gate pad. On its bottom side facing the leadframe (not visible in FIG. 3), the power component 104 comprises a second load pad 136 embodied as a drain pad (shown as a backside contact in the cross section of FIG. 4). The first load pad 134 is arranged on a first side of the power component 104, the control pad 138 is also arranged on the first side of the power component 104, and the second load pad 136 is arranged on a second side of the power component 108, opposite to the first side of the power component 108. The power component 104 is thus configured as a power device with vertical current flow, i.e. a current flow perpendicular to the paper plane of FIG. 3 and in a vertical direction according to FIG. 4 between the source pad and the drain pad, when an appropriate control signal at the gate pad renders the field effect transistor electrically conductive. Advantageously, the power component 104 may be manufactured as a silicon carbide or gallium nitride chip, and thus with very small dimensions. Although such a power component 104, in view of its small dimensions, is not easily suitable for a conventional stacked chip configuration, the illustrated package design of FIG. 3 and FIG. 4 is perfectly compatible with silicon carbide and gallium nitride chips.

In the shown embodiment, the power component 104 is configured as low side switch, whereas it can be configured as high side switch in other embodiments.

Now specifically referring to FIG. 3, the illustrated first load pad 134 embodied as source pad is here composed of four separate source cells which may be connected for example electrically in parallel. Any other arrangement with a larger or smaller number of source cells is possible as well. Furthermore, the top side of the power component 104 comprises a source sense pad 160 at which a voltage signal, etc., may be sensed. As shown as well in FIG. 3, control pad 138 embodied as gate pad may have a smaller pad area than the aforementioned pads 134, 160.

Although not shown in FIG. 3 and FIG. 4, the power component 104 may be alternatively a bipolar transistor component with a collector pad as first load pad 134, an emitter pad as second load pad 136, and a base pad as control pad 138. In such an embodiment, the power component 104 may for instance be an insulated gate bipolar transistor (IGBT) chip.

Moreover, the package 100 according to FIG. 3 and FIG. 4 comprises a logic component 108. The logic component 108 may have an active front side and a back side. The front side of the logic component 108 is arranged face-up, i.e. faces away from the leadframe. The front side of the logic component 108 may be the active chip side and may comprise one or more monolithically integrated circuit elements. The back side of the logic component 108 may be the semiconductor body side. Advantageously, the logic component 108 is directly electrically conductively mounted on the second load terminal 106. More specifically, the logic component 108 is mounted on the top side of the second load terminal 106 by electrically conductive connection medium 112 to thereby create a direct electric connection between the back side of the logic component 108 and the top side of the metallic second load terminal 106 without dielectric isolation in between. For instance, the electrically conductive connection medium 112 may be silver glue, eutectic material, a soft solder, or a diffusion solder. As a consequence of this electric coupling, the back side of the logic component 108 is at a defined electric potential corresponding to the electric potential of the second load terminal 106 which may be a source terminal since it is coupled with the source pad (see reference sign 134) of the power component 104 by electrically conductive connection elements 140 (such as bond wires). According to FIG. 3 and FIG. 4, the second load terminal 106 on which the logic component 108 is mounted is a source terminal at the electric potential of the source pad of the power component 104. Advantageously, the electric potential of the source terminal may be the electric ground terminal, so that the back side of the logic component 108 remains at electric ground potential during operation of the package 100. Thus, the source-related second load terminal 106 on which the logic component 108 is mounted may be an electric ground potential terminal of the package 100. Advantageously, the described electric coupling prevents the logic component 108 from floating and therefore allows operation of the logic component 108 at constant and well-defined operating conditions. By the direct electric connection between the back side of the logic component 108 and the source terminal of the leadframe as a result of the assembly of the logic component 108 using the electrically conductive connection medium 112, a short electric path is established which reduces losses, keeps the effort of grounding the logic component 108 small, and promotes a compact design of the package 100.

Moreover, a pad on the upper main surface of the logic component 108 is electrically coupled by an electrically conductive connection element 140 (in particular a bond wire) with the control pad 138 on the top side of the power component 104. Consequently, the logic component 108 may supply an electric control signal to the control pad 138 of the power component 104 for controlling operation of the power component 104, in particular for switching it. Thus, during operation of the package 100, the logic component 108 may provide a drive function for driving the power component 104.

It is also possible that the logic component 108 fulfils a sense function for sensing an electric signal (for instance a voltage signal or a current signal, for instance indicative of a temperature) of the power component 104. Such a sensed signal may be used, in turn, as a basis for controlling the power component 104. For this purpose, an electrically conductive connection between the source sense pad 160 and a pad on the upper main surface of the logic component 108 may be established by a further electrically conductive connection element 140 such as a further bond wire.

Advantageously, the logic component 108 is mounted on the second load terminal 106, whereas the power component 104 is mounted on the first load terminal 102. Thus, components 104, 108 are arranged side-by-side rather than vertically stacked on each other and can therefore be thermally separated from each other. Consequently, heat generated by ohmic losses (and the like) during operation of the components 104, 108 will occur in different regions of the package 100 so that hot spots may be avoided. In other words, heat is distributed more evenly due to the shown positioning of the components 104, 108. Thus, the thermal performance of the package 100 may be excellent. At the same time, the arrangement of the logic component 108 and the power component 104 side-by-side rather than vertically stacked has the advantage of a more flexible design. Descriptively speaking, the logic component 108 may be assembled on any desired free area, for instance on the lead-type second load component 106, so that also very small SiC-based or GaN-based power components 104 may be implemented without the need of reserving a surface area on the power components 104 for assembling the logic component 108 thereon.

As shown in FIG. 3 and FIG. 4, the power component 104 has a larger surface area than the logic component 108. In view of its small surface area, the logic component 108 finds sufficient free area on the relatively small second load terminal 106. In contrast to this, the larger power component 104 may be conveniently mounted on the larger first load terminal 102. Hence, the package architecture according to FIG. 3 and FIG. 4 provides an area optimized layout and results in a compact package 100 while providing a high degree of freedom for a package designer.

In the illustrated embodiment, a plurality of electrically conductive connection elements 140 are provided for flexibly establishing substantially any desired electric circuitry between the semiconductor components 104, 108 and the metallic terminals 102, 106, 142. These electrically conductive connection elements 140 are here embodied as bond wires, but may be alternatively bond ribbons, clips, etc. In particular, FIG. 3 shows an additional electrically conductive connection element 140 which electrically couples a pad on an upper main surface of the logic component 108 with the second load terminal 106. Furthermore, electrically conductive connection elements 140 are provided which electrically couple one or more pads on an upper main surface of the logic component 108 with a respective one of the third terminals 142. Other electrically conductive connection elements 140 electrically couple one or more pads on an upper main surface of the logic component 108 with the power component 104, more specifically with the control pad 138 and the source sense pad 160. Still other electrically conductive connection elements 140 couple the individual source cells (relating to the first load pad 134 embodied as source pad) of the power component 104 with the second load terminal 106. Hence, an array of multiple electrically conductive connection elements 140 may be freely designed for establishing the desired connection of the package 100 with low effort.

Now referring to FIG. 4, package 100 comprises a mold-type encapsulant 110 which only partially encapsulates the first load terminal 102, only partially encapsulates the second load terminal 106, only partially encapsulates the third terminals 142, fully encapsulates the power component 104, and fully encapsulates the logic component 108. Also the electrically conductive connection elements 140 are fully encapsulated within the mold compound constituting encapsulant 110 so as to be mechanically and electrically protected.

As shown in FIG. 4, the first load terminal 102, the second load terminal 106 and the third terminals 142 have a common surface at a lower main face of the package 100. More specifically, terminals 102, 106, 142 may have coplanar bottom surfaces, i.e. bottom surfaces which lie in a common (here horizontal) plane.

Portions of the terminals 102, 106, 142 protruding beyond the encapsulant 110 may be electrically connected with pads 170 on a top side of a mounting base 132, such as a printed circuit board (PCB). This connection may be established by soldering, i.e. using solder structures 172 (for example comprising tin) between the respective terminals 102, 106, 142 and the pads 170.

What concerns the denotation "load terminals", it should be appreciated that the first load terminal 102 is here embodied as drain terminal, since the drain pad of the transistor-type power component 104 is electrically conductively mounted on the first load terminal 102. Furthermore, the second load terminal 106 is here embodied as source terminal, since the source pad of the transistor-type power component 104 is electrically conductively coupled with the second load terminal 106 by electrically conductive connection elements 140. Consequently, the terminals 102, 106 are electrically connected within the current path of the power component 104 of the package 100, since an electric power signal is to be transmitted between the source pad and the drain pad of the power component 104 when an electric signal at the gate pad switches the channel region of the power component 104 into an electrically conductive state.

FIG. 5 illustrates a plan view of a package 100 according to another exemplary embodiment.

The embodiment of FIG. 5 differs from the embodiment of FIG. 3 and FIG. 4 in particular in that, according to FIG. 5, the bottom surface of the logic component 108 (more precisely its chip back side) is mounted on the first load terminal 102 rather than on the second load terminal 106. As a result, the logic component 108 is mounted on a drain terminal at the electric potential of the drain pad of the power component 104. Hence, according to FIG. 5, both components 104, 108 are mounted on the same body of the multi-body carrier, i.e. are both mounted on the first load terminal 102. Thus, if there is sufficient mounting area on the first load terminal 102, both components 104, 108 may be flexibly mounted here. Also in the embodiment of FIG. 5, the bottom-sided back side of the logic component 108 may be at a defined electric potential, i.e. at drain potential, and is therefore advantageously prevented from undesired floating. Apart from this difference, the circuitry according to FIG. 5 may be similar to that according to FIG. 3. A comparison of FIG. 5 with FIG. 3 shows the high freedom of design with the package architecture according to exemplary embodiments.

Although only two electronic components 104, 108 are shown in the embodiments illustrated in the figures, it is possible according to another exemplary embodiments that one or more additional electronic components are present. For instance, it is possible that a diode chip and/or at least one further transistor chip is foreseen.

It should be noted that the term "comprising" does not exclude other elements or features and the "a" or "an" does not exclude a plurality. Also, elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A package, which comprises:
   a leadless first load terminal;
   a second load terminal smaller than the first load terminal;
   a power component mounted on the first load terminal;
   a logic component electrically conductively mounted on one of the first load terminal and the second load terminal and electrically connected with the power component for controlling the power component; and
   least one electrically conductive connection element which electrically couples the logic component with the second load terminal;
   wherein the logic component is configured for sensing a signal which is indicative for a temperature.

* * * * *